United States Patent
Nawata

(10) Patent No.: US 7,733,462 B2
(45) Date of Patent: Jun. 8, 2010

(54) EXPOSURE APPARATUS AND EXPOSURE METHOD

(75) Inventor: Ryo Nawata, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 489 days.

(21) Appl. No.: 11/378,495

(22) Filed: Mar. 17, 2006

(65) Prior Publication Data

US 2006/0209283 A1    Sep. 21, 2006

(30) Foreign Application Priority Data

Mar. 18, 2005    (JP) .............................. 2005-080586

(51) Int. Cl.
    G03B 27/42    (2006.01)
(52) U.S. Cl. ...................................................... 355/53
(58) Field of Classification Search .................. 355/52, 355/53, 55, 67, 118, 119, 120
    See application file for complete search history.

(56) References Cited

U.S. PATENT DOCUMENTS

| | | | |
|---|---|---|---|
| 5,187,519 A | 2/1993 | Takabayashi et al. | 355/53 |
| 6,359,678 B1* | 3/2002 | Ota | 355/53 |
| 6,388,733 B1* | 5/2002 | Hayashi | 355/53 |
| 6,473,159 B1* | 10/2002 | Wakui et al. | 355/53 |
| 6,727,981 B2* | 4/2004 | Taniuchi et al. | 355/55 |
| 7,130,016 B2* | 10/2006 | Miyajima | 355/30 |
| 7,154,582 B2* | 12/2006 | Ohsaki | 355/53 |
| 7,170,587 B2* | 1/2007 | Dierichs et al. | 355/71 |
| 2001/0026408 A1* | 10/2001 | Tanaka | 359/826 |
| 2002/0070355 A1* | 6/2002 | Ota | 250/492.2 |
| 2002/0171815 A1* | 11/2002 | Matsuyama et al. | 355/55 |
| 2002/0196421 A1* | 12/2002 | Tanaka et al. | 355/72 |
| 2003/0156270 A1* | 8/2003 | Hunter | 355/72 |
| 2003/0169411 A1* | 9/2003 | Ota | 355/55 |
| 2003/0179354 A1* | 9/2003 | Araki et al. | 355/53 |
| 2003/0197841 A1* | 10/2003 | Araki et al. | 355/50 |
| 2004/0083966 A1* | 5/2004 | Takahashi et al. | 118/715 |
| 2004/0114121 A1* | 6/2004 | Nishi et al. | 355/67 |
| 2004/0135980 A1* | 7/2004 | Hill | 355/52 |
| 2004/0156026 A1* | 8/2004 | Kamiya | 355/30 |
| 2004/0179192 A1* | 9/2004 | Mizuno et al. | 356/139.1 |
| 2004/0189964 A1* | 9/2004 | Nijmeijer et al. | 355/55 |
| 2005/0018162 A1* | 1/2005 | Leenders et al. | 355/67 |
| 2005/0041233 A1* | 2/2005 | Van Schothorst et al. | 355/72 |
| 2005/0063288 A1* | 3/2005 | Nawata et al. | 369/125 |

(Continued)

FOREIGN PATENT DOCUMENTS

JP    2003-158059    5/2003

(Continued)

*Primary Examiner*—Georgia Y Epps
*Assistant Examiner*—Daniell L Owens
(74) *Attorney, Agent, or Firm*—Cowan, Liebowitz & Latman, P.C.

(57) ABSTRACT

An exposure apparatus includes a beam providing unit having a first component and second component to provide an exposure beam having pattern information to a substrate W, a measurement unit which measures a relative variation between the first component and the second component, a driving mechanism which drives at least one of the first component and second component, and a compensator which controls the driving mechanism on the basis of the measurement result obtained by the measurement unit so as to reduce the relative variation between the first component and the second component in at least the period during which the pattern is transferred onto the substrate.

9 Claims, 7 Drawing Sheets

U.S. PATENT DOCUMENTS

| | | | |
|---|---|---|---|
| 2005/0134818 A1* | 6/2005 | Van Dijsseldonk et al. | 355/55 |
| 2005/0140947 A1* | 6/2005 | Miyajima | 355/30 |
| 2005/0168712 A1* | 8/2005 | Miyajima | 355/30 |
| 2005/0184248 A1* | 8/2005 | Kanazawa et al. | 250/372 |
| 2005/0225739 A1* | 10/2005 | Hiura | 355/67 |
| 2005/0231706 A1* | 10/2005 | Yang et al. | 355/72 |
| 2005/0275815 A1* | 12/2005 | Silverbrook | 355/18 |
| 2006/0001857 A1* | 1/2006 | Cherala et al. | 355/72 |
| 2006/0023180 A1* | 2/2006 | Hara | 355/53 |
| 2006/0033895 A1* | 2/2006 | Singer | 355/53 |
| 2006/0092392 A1* | 5/2006 | Sumiyoshi et al. | 355/30 |
| 2007/0273859 A1* | 11/2007 | Komatsuda | 355/67 |
| 2009/0086178 A1* | 4/2009 | Shibazaki | 355/53 |

FOREIGN PATENT DOCUMENTS

WO    WO 2005031466 A1 *   4/2005

* cited by examiner

EXPOSURE APPARATUS AND EXPOSURE METHOD

FIELD OF THE INVENTION

The present invention relates to an exposure apparatus which transfers a pattern onto a substrate.

BACKGROUND OF THE INVENTION

Conventionally, a process of manufacturing a semiconductor device formed from a micropattern such as an LSI or VLSI adopts a reduction projection exposure apparatus which reduces a pattern formed on a reticle (mask) and projects and transfers it onto a substrate coated with a photosensitive agent. To increase the degree of integration of a semiconductor element, further micropatterning is required. The exposure apparatus takes a measure to attain micropatterning along with the development of a resist process.

As a technique for increasing the resolving power of an exposure apparatus, a method of shortening the exposure wavelength or a method of increasing the numerical aperture (NA) of a projection optical system is used. In general, the resolving power is known to be proportional to the exposure wavelength and inversely proportional to the NA.

As such a measure for micropatterning is taken, the throughput of an exposure apparatus is further improved in view of the manufacturing cost of semiconductor elements. For example, there is available a method of shortening the exposure time per shot by increasing the output from an exposure light source, or a method of increasing the number of elements per shot by widening an exposure area.

However, vibration conducted to an exposure apparatus for micropattern exposure from its installation floor, or slight vibration or deformation generated by a built-in movable unit (for example, a mask stage or substrate stage) degrades the overlay exposure accuracy or exposure image accuracy. Furthermore, if exposure is not executed until such vibration or deformation is reduced, the throughput decreases.

A conventional exposure apparatus adopts a technique for supporting its main body portion by an anti-vibration table or a technique for absorbing a reaction force in acceleration/deceleration of the built-in movable unit, in order to reduce the influence of floor vibration or its internal vibration.

As described above, however, the NA of a projection optical system and an exposure area are getting larger, and the output from a light source increases. Moreover, the use of a modified illumination method which controls the distribution of a secondary source with various manners and illuminates to attain high resolution is spreading. As a result, the size and weight of an illumination optical system are increasing. This may have an influence on a vibration suppression characteristic with respect to the apparatus main body.

To solve this problem, a method of arranging a light source or illumination optical system separately from the exposure apparatus main body portion is known to be effective.

Japanese Patent Laid-Open No. 2003-158059 discloses an exposure apparatus which supports an illumination optical system separately from its main body portion. This apparatus uses a sensor to measure the relative position between the illumination optical system and the main body portion, and means which calibrates the sensor. Japanese Patent Laid-Open No. 2003-158059 also discloses the following techniques. When an abnormality is found on the basis of a measurement value obtained by the sensor, a light source, reticle driving means, and substrate driving means are stopped. When an actuator corrects the orientation of the illumination optical system to be a normal state, the exposure operation is restarted. However, Japanese Patent Laid-Open No. 2003-158059 does not disclose any technique for dynamically controlling the orientation of the illumination optical system so as to correct, during exposure, the relative position between the illumination optical system and the main body portion on the basis of the output from the sensor.

As micronization of the pattern to be transferred onto a substrate advances, the positional relationship between the illumination optical system and the main body portion need be held in the original state more strictly. For example, assume that the relative positional relationship between the main body portion and the illumination optical system varies upon a change in orientation of the main body portion. At this time, an optical axis deviation or incident angle deviation of illumination light occurs. This makes illuminance nonuniform or deforms the exposure image, so required exposure accuracy cannot be satisfied. Furthermore, the wait time until vibration is attenuated increases, resulting in a decrease in throughput.

SUMMARY OF THE INVENTION

The present invention has been made in consideration of the above problems, and has as its object to, for example, dynamically reduce, in pattern transfer, a relative variation between components in a beam providing unit which provides an exposure light beam having pattern information to a substrate.

According to the first aspect of the present invention, there is provided an exposure apparatus which transfers a pattern onto a substrate, comprising a beam providing unit including at least a first component and second component to provide an exposure light beam having pattern information to the substrate, a measurement unit which measures a relative variation between the first component and the second component, a driving mechanism which drives at least one of the first component and second component, and a controller which controls the driving mechanism on the basis of a measurement result obtained by the measurement unit so as to reduce a relative variation between the first component and the second component in at least a period during which the pattern is transferred onto the substrate.

According to a preferred embodiment of the present invention, the first component comprises, for example, a structure including a projection optical system, and the second component comprises, for example, a structure including an illumination optical system. Alternatively, the first component comprises, for example, a structure including an illumination optical system, and the second component comprises, for example, a light source device.

According to a preferred embodiment of the present invention, the relative variation can include a variation in relative position, a variation in relative velocity, or a variation in relative acceleration.

According to a preferred embodiment of the present invention, the measurement unit can include a first measurement device which measures a relative variation between the first component and a reference structure, a second measurement device which measures a relative variation between the second component and the reference structure, and an arithmetic device which calculates a relative variation between the first component and the second component on the basis of a measurement result obtained by the first measurement device and a measurement result obtained by the second measurement device.

According to a preferred embodiment of the present invention, the measurement unit can include one of a laser interferometer, an encoder, a capacitance sensor, an eddy current sensor and a differential transducer type displacement sensor.

According to a preferred embodiment of the present invention, the driving mechanism can include one of a linear motor, a piezoelectric element and an air actuator.

According to a preferred embodiment of the present invention, the first component and second component are supported independently of each other.

According to the second aspect of the present invention, there is provided an exposure method of transferring a pattern onto a substrate by using an exposure apparatus comprising a beam providing unit including at least a first component and second component to provide an exposure beam having pattern information to the substrate, and a measurement unit which measures a relative variation between the first component and the second component, comprising driving at least one of the first component and second component on the basis of a measurement result obtained by the measurement unit so as to reduce the relative variation between the first component and the second component in at least a period during which the pattern is transferred onto the substrate.

According to the present invention, for example, a relative variation between components in a light beam providing unit which provides a light beam having pattern information to a substrate can be dynamically reduced in pattern transfer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

An exposure apparatus and exposure method according to the present invention are preferable to manufacture by lithography various devices such as a semiconductor chip such as an IC or LSI, a display element such as a liquid crystal panel, a detection element such as a magnetic head, and an image sensing element such as a CCD.

For example, the present invention can be applied to an exposure apparatus using UV light as an exposure light beam, and additionally, to an exposure apparatus using, as an exposure light beam, extreme ultraviolet (EUV) light, X-rays, an electron beam, or a charged-particle beam. In order to provide a more concrete example, however, an example in which the present invention is applied to an exposure apparatus which uses EUV light as an exposure beam will be described below.

First Embodiment

Figure 1:
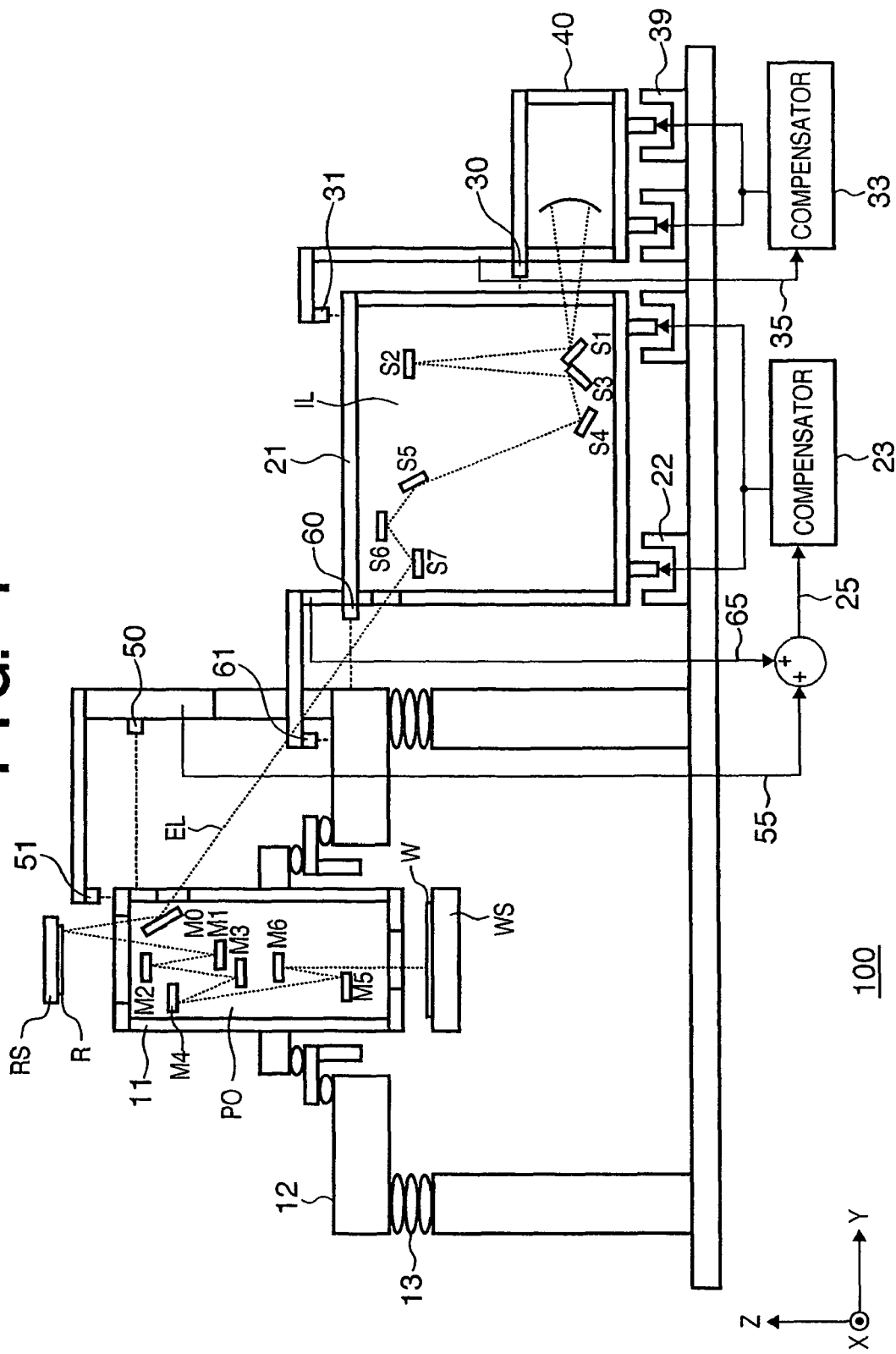
FIG. 1 is a view schematically showing the overall structure of an exposure apparatus according to the first embodiment of the present invention.

FIG. 1 is a view schematically showing the overall structure of an exposure apparatus 100 according to the first embodiment of the present invention. The exposure apparatus 100 is constituted as a projection exposure apparatus which uses EUV light as an exposure beam EL to execute exposure (pattern transfer) for a substrate by the step & scan scheme.

The exposure apparatus 100 has a projection optical system PO to project a light beam reflected by a reflection type reticle R as the original perpendicularly onto a wafer W as the substrate. The reflected light beam contains information about the pattern formed on the reflection type reticle R.

In the following description, a direction in which the projection optical system PO projects the EUV light beam EL onto the wafer W is defined as the optical axis direction of the projection optical system PO. This optical axis direction is defined as the Z-axis direction. A direction in a plane perpendicular to the Z-axis direction on the sheet surface of FIG. 1 is defined as the Y-axis direction. A direction perpendicular to the sheet surface is defined as the X-axis direction.

While projecting an image of part of the device pattern drawn on the reflection type reticle R onto the wafer W through the projection optical system PO, the exposure apparatus 100 relatively scans the reticle R and wafer W in a one-dimensional direction (the Y-axis direction in this case) with respect to the projection optical system PO. With this operation, the images which form the entire device pattern on the reticle R are transferred onto a plurality of shot regions on the wafer W by the step & scan scheme.

The exposure apparatus 100 comprises a beam providing unit to provide an EUV light beam (exposure beam) having pattern information to the wafer W driven by a wafer stage WS. The beam providing unit can include, for example, (a) a light source device 40 to provide the EUV light beam EL, (b) an illumination system structure 21 including an illumination optical system IL, (c) a mirror MO to reflect the EUV light beam EL and thereby apply it to the pattern surface of the reticle R, (d) a reticle stage RS to hold the reticle R, and (e) a lens barrel including the projection optical system PO consisting of reflection type optical systems to project the EUV light beam EL reflected by the pattern surface of the reticle R perpendicularly onto the exposure target surface of the wafer W coated with a photosensitive agent.

A lens barrel base 12 includes noncontact measurement devices 50 to 52 (the noncontact measurement device 52 is omitted for the sake of drawing convenience) to measure the relative position of a lens barrel 11 with respect to the lens barrel base 12. As the noncontact measurement device, a laser interferometer, for example, can be used.

The noncontact measurement device 50 measures a relative position Y1 of the lens barrel 11 in the Y-axis direction with respect to the lens barrel base 12, and a relative rotation angle θx1 around the X-axis. The noncontact measurement device 51 measures a relative position Z1 of the lens barrel 11 in the Z-axis direction with respect to the lens barrel base 12. The noncontact measurement device 52 (which is not shown but can be typically arranged so as to make the measurement optical axis parallel to the X-axis) measures a relative position X1 of the lens barrel 11 in the X-axis direction with respect to the lens barrel base 12, a relative rotation angle θy1 around the Y-axis, and a relative rotation angle θz1 around the Z-axis. With this arrangement, a relative position 55, having six degrees of freedom, of the lens barrel 11 with respect to the lens barrel base 12 can be obtained.

In this case, the noncontact measurement devices 50 to 52 measure the relative position, having six degrees of freedom, of the lens barrel 11 with respect to the lens barrel base 12. Instead or in addition to this, the noncontact measurement devices 50 to 52 may measure a relative velocity or relative acceleration, having six degrees of freedom, of the lens barrel 11 with respect to the lens barrel base 12.

The illumination system structure 21 or lens barrel base 12 includes noncontact measurement devices 60 to 62 (the noncontact measurement device 62 is omitted for the sake of drawing convenience) to measure the relative position of the lens barrel base 12 with respect to the illumination system structure 21. In the embodiment shown in FIG. 1, the illumination system structure 21 includes the noncontact measurement devices 60 to 62. The noncontact measurement device 60 measures a relative position Y2 of the lens barrel base 12 in the Y-axis direction with respect to the illumination system structure 21, and a relative rotation angle θx2 around the X-axis. The noncontact measurement device 61 measures a relative position Z2 of the lens barrel base 12 in the Z-axis direction with respect to the illumination system structure 21. The noncontact measurement device 62 (which is not shown but can be typically arranged so as to make the measurement optical axis parallel to the X-axis) measures a relative position X2 of the lens barrel base 12 in the X-axis direction with respect to the illumination system structure 21, a relative rotation angle θy2 around the Y-axis, and a relative rotation angle θz2 around the Z-axis. With this arrangement, a relative position 65, having six degrees of freedom, of the lens barrel base 12 with respect to the illumination system structure 21 can be obtained.

In this case, the noncontact measurement devices 60 to 62 measure the relative position, having six degrees of freedom, of the lens barrel base 12 with respect to the illumination system structure 21. Instead or in addition to this, the noncontact measurement devices 60 to 62 may measure a relative velocity or relative acceleration, having six degrees of freedom, of the lens barrel base 12 with respect to the illumination system structure 21.

A relative position 25 (or relative velocity or relative acceleration), having six degrees of freedom, of the illumination system structure 21 with respect to the lens barrel 11 can be continuously obtained on the basis of the relative position 55 (or relative velocity or relative acceleration) and the relative position 65 (or relative velocity or relative acceleration).

Figure 5:
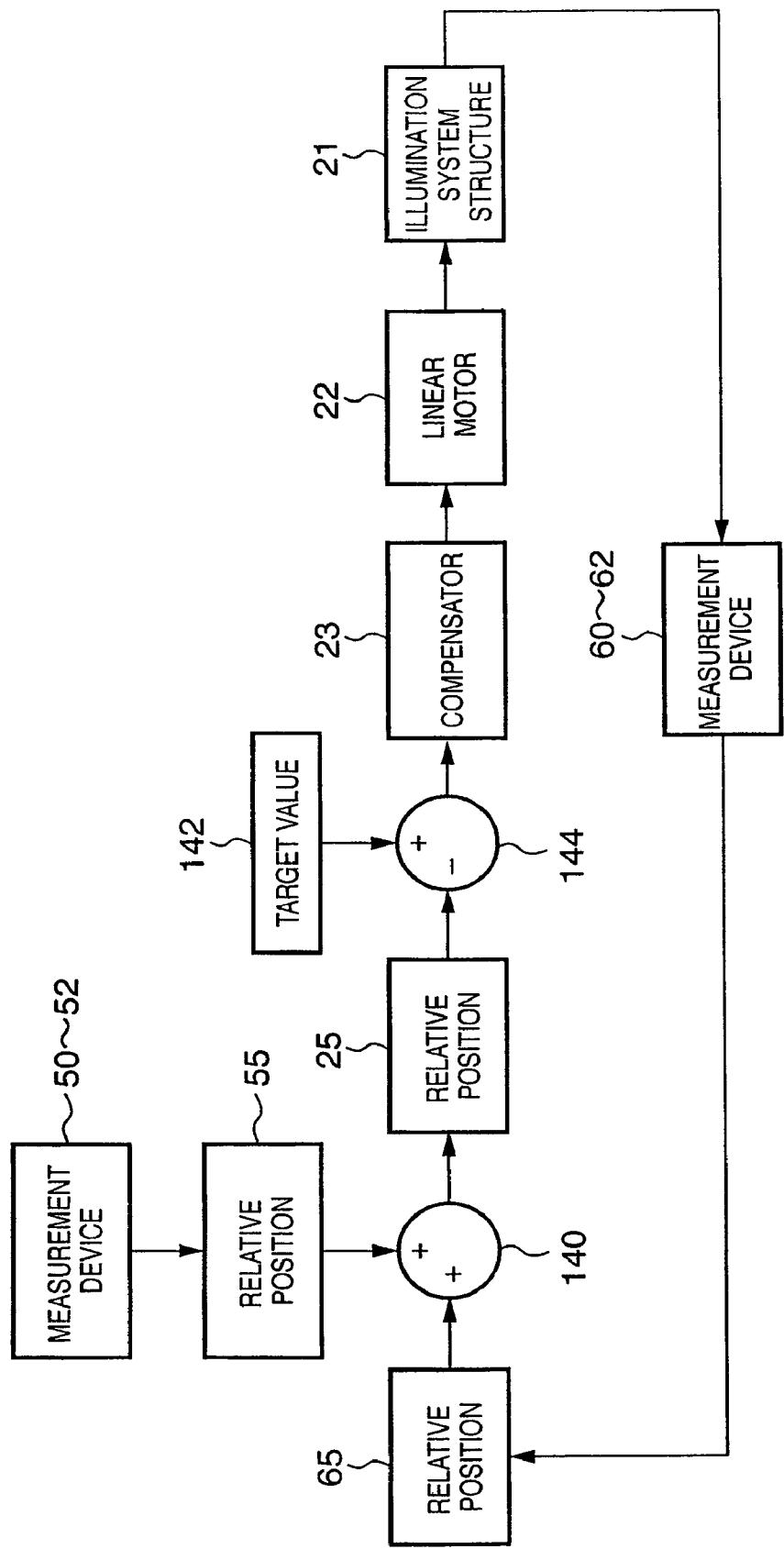
FIG. 5 is a block diagram showing an example of the arrangement of a control system to control a relative variation between a lens barrel and an illumination system structure in the exposure apparatus shown in FIG. 1.

FIG. 5 is a block diagram showing an example of the arrangement of a control system to control a relative variation between the lens barrel 11 and the illumination system structure 21 in the exposure apparatus 100 shown in FIG. 1. In order to reduce a relative variation between the lens barrel 11 and the illumination system structure 21, the exposure apparatus 100 comprises a compensator (controller) 23 and a driving mechanism 22 to drive the illumination system structure 21 with six degrees of freedom. As the driving mecha-nism 22, for example, a linear motor having a performance that is excellent in response speed, alignment accuracy, and thrust is preferable. As the compensator 23, a PID compensator, for example, is preferable.

On the basis of the relative position 55 (or relative velocity or relative acceleration) and the relative position 65 (or relative velocity or relative acceleration), an arithmetic device 140 continuously calculates the relative position 25 (or relative velocity or relative acceleration), having six degrees of freedom, of the illumination system structure 21 with respect to the lens barrel 11.

An arithmetic device 144 calculates a deviation between a target position (or relative velocity or relative acceleration), having six degrees of freedom, of the illumination system structure 21 with respect to the lens barrel 11, and the relative position 25 (or relative velocity or relative acceleration) having six degrees of freedom. The arithmetic result is sent to the compensator 23.

On the basis of a deviation continuously sent from the arithmetic device 144, the compensator 23 controls the driving mechanism (linear motor) 22 (preferably, executes PID control) so as to reduce the deviation. More specifically, on the basis of a deviation continuously sent from the arithmetic device 144, the compensator 23 continuously calculates a command value to be notified to the driving mechanism (linear motor) 22. The compensator 23 continuously notifies the driving mechanism 22 of the command value.

On the basis of a deviation (i.e., a relative variation between the lens barrel 11 and the illumination system structure 21) continuously sent from the arithmetic device 144, the compensator 23 controls the driving mechanism (linear motor) 22 so as to reduce the deviation in at least the period during which the pattern is transferred onto the wafer W (i.e., during exposure). The compensator 23 may control the driving mechanism 22 on the basis of the deviation sent from the arithmetic device 144 even in the non-exposure period, for example, in the period between the exposure time of one shot region and the exposure time of the next shot region.

The alignment accuracy of the control system illustrated in FIG. 5 is desirably set such that a region in which the reticle R is irradiated with an EUV light beam falls within a design value ±1 mm in both the X and Y directions.

In the example shown in FIGS. 1 and 5, the driving mechanism 22 drives the illumination system structure 21 so as to reduce a relative variation between the illumination system structure 21 and the lens barrel base 12. Instead or in addition to this, a driving mechanism which drives the lens barrel base 12 may be provided.

Moreover, as illustrated in FIG. 1, the illumination system structure 21 can be arranged separately from the light source device 40. The light source device 40 or illumination system structure 21 includes noncontact measurement devices 30 to 32 (the noncontact measurement device 32 is omitted for the sake of drawing convenience) to measure a relative position (or relative velocity or relative acceleration) 35 between the light source device 40 and the illumination system structure 21. In the embodiment shown in FIG. 1, the light source device 40 includes the noncontact measurement devices 30 to 32. The noncontact measurement device 30 measures a relative position Y3 of the light source device 40 in the Y-axis direction with respect to the illumination system structure 21, and a relative rotation angle θx3 around the X-axis. The noncontact measurement device 31 measures a relative position Z3 of the light source device 40 in the Z-axis direction with respect to the illumination system structure 21. The noncontact measurement device 32 (which is not shown but can be typically arranged so as to make the measurement optical axis parallel to the X-axis) measures a relative position X3 of the light source device 40 in the X-axis direction with respect to the illumination system structure 21, a relative rotation angle θy3 around the Y-axis, and a relative rotation angle θz3 around the Z-axis. With this arrangement, a relative position 35, having six degrees of freedom, of the light source device 40 with respect to the illumination system structure 21 can be continuously obtained.

In this case, the noncontact measurement devices 30 to 32 measure the relative position, having six degrees of freedom, of the light source device 40 with respect to the illumination system structure 21. Instead or in addition to this, the noncontact measurement devices 30 to 32 may measure a relative velocity or relative acceleration, having six degrees of freedom, of the light source device 40 with respect to the illumination system structure 21.

The exposure apparatus 100 comprises a second control system to control a relative variation between the illumination system structure 21 and the light source device 40. In order to reduce a relative variation between the illumination system structure 21 and the light source device 40, the second control system comprises a compensator (controller) 33 and a driving mechanism 39 to drive the light source device 40 with six degrees of freedom. As the driving mechanism 39, for example, a linear motor having a performance that is excellent in response speed, alignment accuracy, and thrust is preferable. As the compensator 33, a PID compensator, for example, is preferable.

On the basis of the continuously received relative position 35 (or relative velocity or relative acceleration) having six degrees of freedom, the compensator 33 continuously controls the driving mechanism 39 so as to reduce a relative variation between the illumination system structure 21 and the light source device 40.

Second Embodiment

The second embodiment is different from the first embodiment in arrangement and method to measure a relative position 25 (or relative velocity or relative acceleration) of an illumination system structure 21 with respect to a lens barrel 11. The arrangement and method to measure the relative position 25 (or relative velocity or relative acceleration) of the illumination system structure 21 with respect to the lens barrel 11 will be mainly described here.

Figure 2:
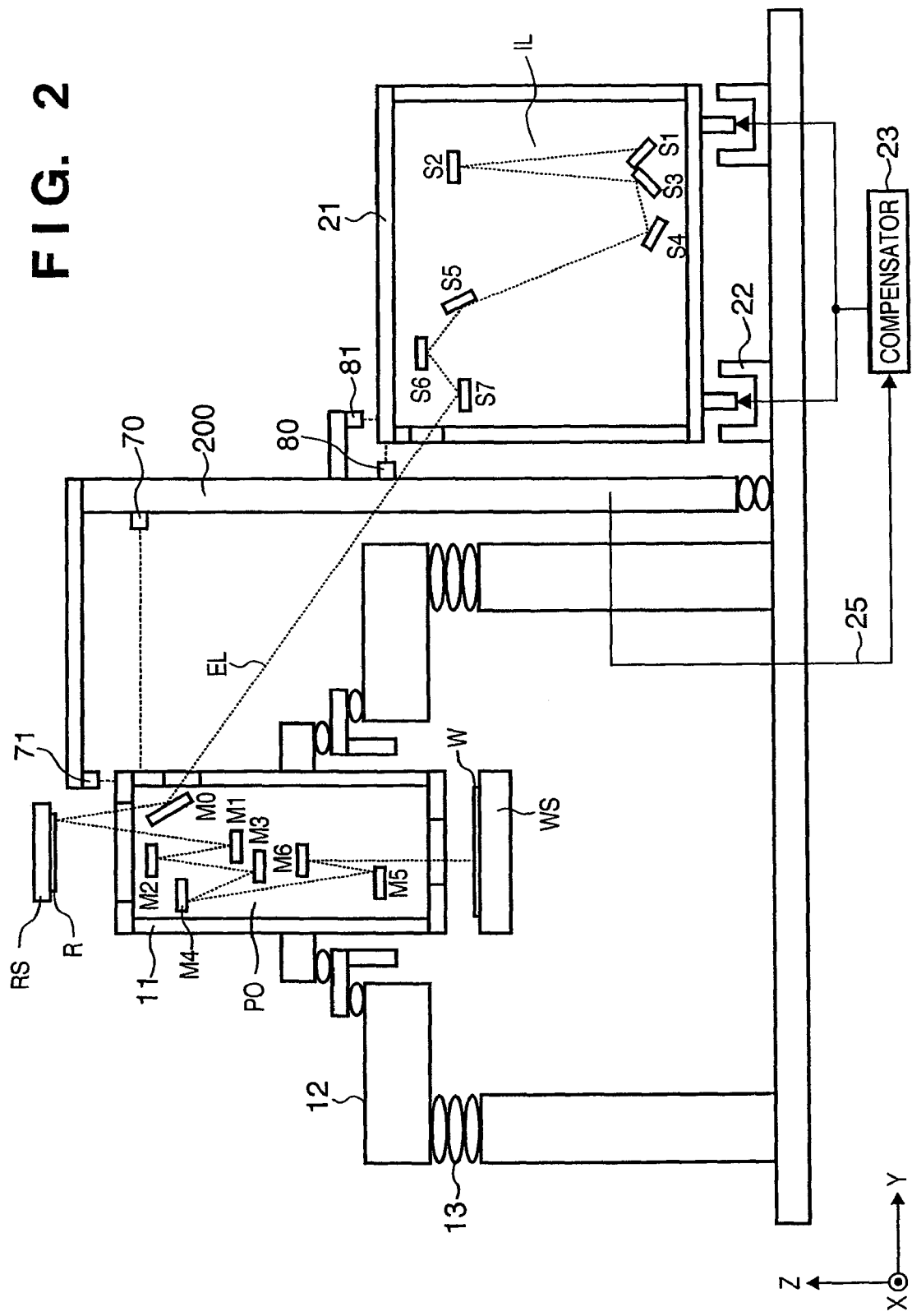
FIG. 2 is a view schematically showing the structure of an exposure apparatus according to the second embodiment of the present invention.

FIG. 2 is a view schematically showing the structure of an exposure apparatus according to the second embodiment of the present invention. In the second embodiment, a relative position 75, having six degrees of freedom, of the lens barrel 11 with respect to a reference structure 200 and a relative position 85, having six degrees of freedom, of the illumination system structure 21 are measured. As illustrated in FIG. 2, a noncontact measurement device 70 measures a relative position Y1 of the lens barrel 11 in the Y-axis direction with respect to the reference structure 200, and a relative rotation angle θx1 around the X-axis. A noncontact measurement device 71 measures a relative position Z1 of the lens barrel 11 in the Z-axis direction with respect to the reference structure 200. A noncontact measurement device 72 (not shown) measures a relative displacement X1 of the lens barrel 11 in the X-axis direction with respect to the reference structure 200, a relative rotation angle θy1 around the Y-axis, and a relative rotation angle θz1 around the Z-axis. With this arrangement, the relative position 75, having six degrees of freedom, of the lens barrel 11 with respect to the reference structure 200 can be obtained.

In this case, the noncontact measurement devices 70 to 72 measure the relative position, having six degrees of freedom, of the lens barrel 11 with respect to the reference structure 200. Instead or in addition to this, the noncontact measurement devices 70 to 72 may measure a relative velocity or relative acceleration, having six degrees of freedom, of the lens barrel 11 with respect to the reference structure 200.

A noncontact measurement device 80 measures a relative position Y2 of the illumination system structure 21 in the Y-axis direction with respect to the reference structure 200, and a relative rotation angle θx2 around the X-axis. A noncontact measurement device 81 measures a relative position Z2 of the illumination system structure 21 in the Z-axis direction with respect to the reference structure 200. A noncontact measurement device 82 (not shown) measures a relative position X2 of the illumination system structure 21 in the X-axis direction with respect to the reference structure 200, a relative rotation angle θy2 around the Y-axis, and a relative rotation angle θz2 around the Z-axis. With this arrangement, a relative position 85, having six degrees of freedom, of the illumination system structure 21 with respect to the reference structure 200 can be obtained.

In this case, the noncontact measurement devices 80 to 82 measure the relative position, having six degrees of freedom, of the illumination system structure 21 with respect to the reference structure 200. Instead or in addition to this, the noncontact measurement devices 80 to 82 may measure a relative velocity or relative acceleration, having six degrees of freedom, of the illumination system structure 21 with respect to the reference structure 200.

A relative displacement 25 (or relative velocity or relative acceleration), having six degrees of freedom, of the illumination system structure 21 with respect to the lens barrel 11 can be continuously obtained on the basis of the relative position 75 (or relative velocity or relative acceleration) and the relative position 85 (or relative velocity or relative acceleration).

Third Embodiment

The third embodiment is different from the first embodiment in arrangement and method to measure a relative position 25 (or relative velocity or relative acceleration) of an illumination system structure 21 with respect to a lens barrel 11. The arrangement and method to measure the relative position 25 (or relative velocity or relative acceleration) of the illumination system structure 21 with respect to the lens barrel 11 will be mainly described here.

Figure 3:
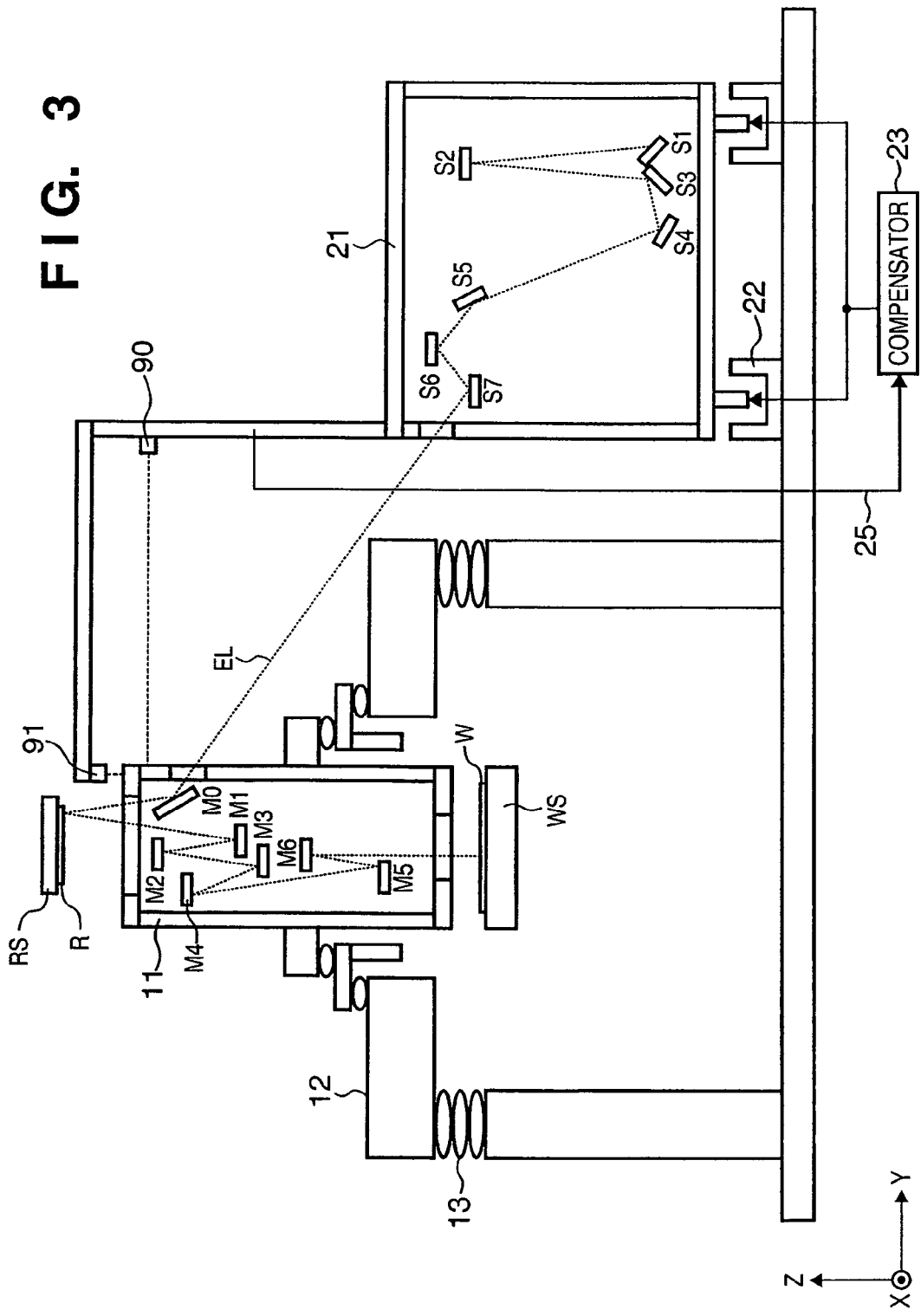
FIG. 3 is a view schematically showing the structure of an exposure apparatus according to the third embodiment of the present invention.

FIG. 3 is a view schematically showing the structure of an exposure apparatus according to the third embodiment of the present invention. In the third embodiment, the relative position 25 (or relative velocity or relative acceleration) of the illumination system structure 21 with respect to the lens barrel 11 are measured directly from the illumination system structure 21 by using noncontact measurement devices 90 to 92.

As illustrated in FIG. 3, the noncontact measurement device 90 measures a relative position Y of the lens barrel 11 in the Y-axis direction with respect to the illumination system structure 21, and a relative rotation angle θx around the X-axis. The noncontact measurement device 91 measures a relative position Z of the lens barrel 11 in the Z-axis direction with respect to the illumination system structure 21. The noncontact measurement device 92 (not shown) measures a relative position X of the lens barrel 11 in the X-axis direction with respect to the illumination system structure 21, a relative rotation angle θy around the Y-axis, and a relative rotation angle θz around the Z-axis. With this arrangement, a relative position 25, having six degrees of freedom, between the lens barrel 11 and the illumination system structure 21 can be continuously obtained.

In this case, the noncontact measurement devices 90 to 92 measure the relative position, having six degrees of freedom, of the lens barrel 11 with respect to the illumination system structure 21. Instead or in addition to this, the noncontact measurement devices 90 to 92 may measure a relative velocity or relative acceleration, having six degrees of freedom, of the lens barrel 11 with respect to the illumination system structure 21.

Fourth Embodiment

Figure 4:
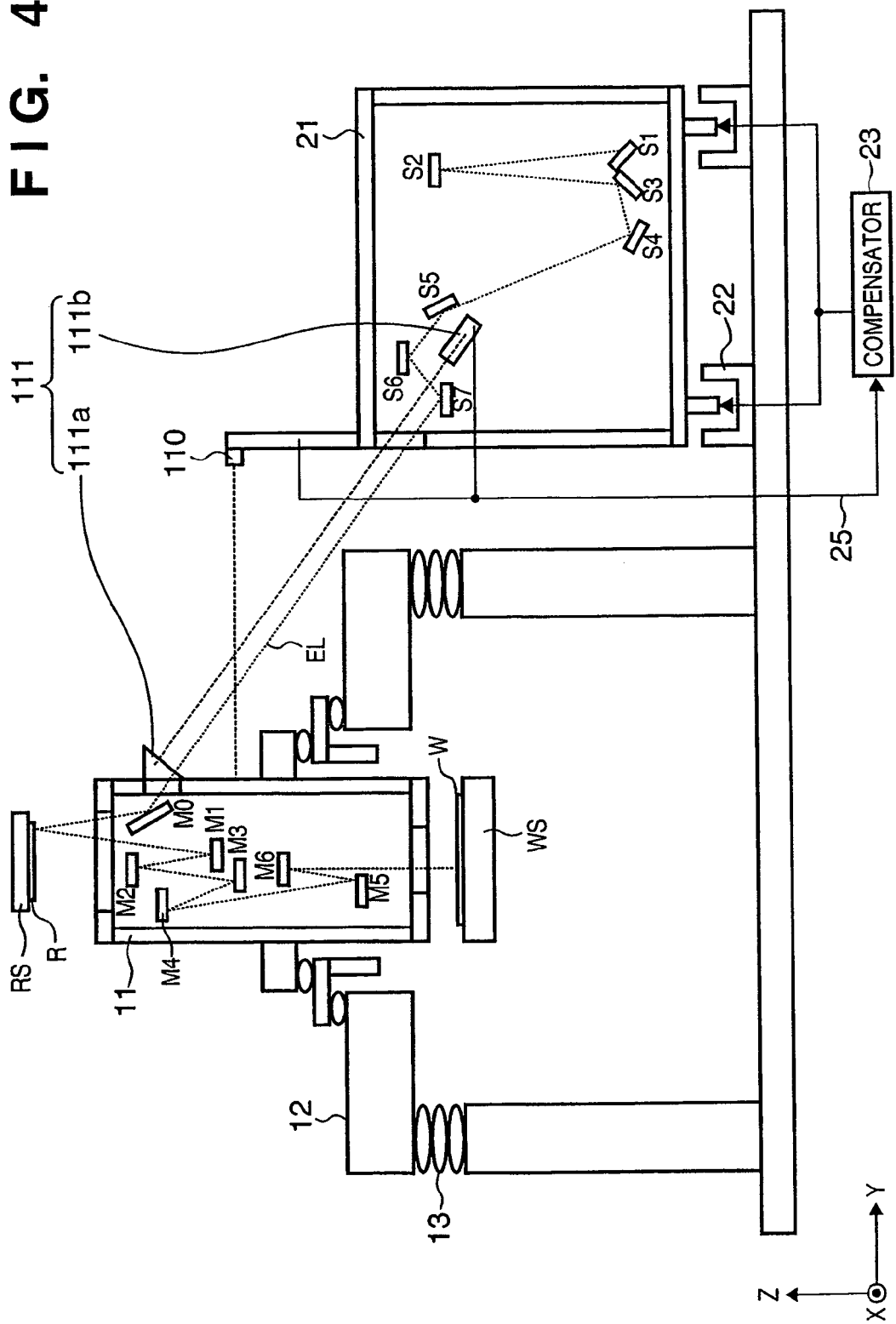
FIG. 4 is a view schematically showing the structure of an exposure apparatus according to the fourth embodiment of the present invention.

The fourth embodiment is a modification of the third embodiment. FIG. 4 is a view schematically showing the structure of an exposure apparatus according to the fourth embodiment of the present invention.

In the fourth embodiment, like the third embodiment, a noncontact measurement device 110 in an exposure apparatus measures a relative position Y of a lens barrel 11 in the Y-axis direction with respect to an illumination system structure 21, and a relative rotation angle θx around the X-axis. A noncontact measurement device 112 (which is omitted for the sake of drawing convenience) can be typically arranged so as to make the measurement optical axis parallel to the X-axis. The noncontact measurement device 112 measures a relative position X of the lens barrel 11 in the X-axis direction with respect to the illumination system structure 21, a relative rotation angle θy around the Y-axis, and a relative rotation angle θz around the Z-axis. A noncontact measurement device 111 includes a mirror 111a and laser interferometer 111b. The mirror 111a can be attached to one of the lens barrel 11 and illumination system structure 21. The laser interferometer 111b can be attached to the other one of the lens barrel 11 and illumination system structure 21. The noncontact measurement device 111 can measure the distance between the lens barrel 11 and the illumination system structure 21.

A relative position Z of the illumination system structure 21 with respect to the lens barrel 11 can be obtained on the basis of measurement information obtained by the noncontact measurement device 111 and the relative position Y of the illumination system structure 21 with respect to the lens barrel 11, which is obtained by the noncontact measurement device 110. With this arrangement, a relative position 25, having six degrees of freedom, of the illumination system structure 21 with respect to the lens barrel 11 can be obtained.

In this case, the noncontact measurement devices 110 to 112 measure the relative position, having six degrees of freedom, of the illumination system structure 21 with respect to the lens barrel 11. Instead or in addition to this, the noncontact measurement devices 110 to 112 may measure a relative velocity or relative acceleration, having six degrees of freedom, of the illumination system structure 21 with respect to the lens barrel 11.

Figure 6:
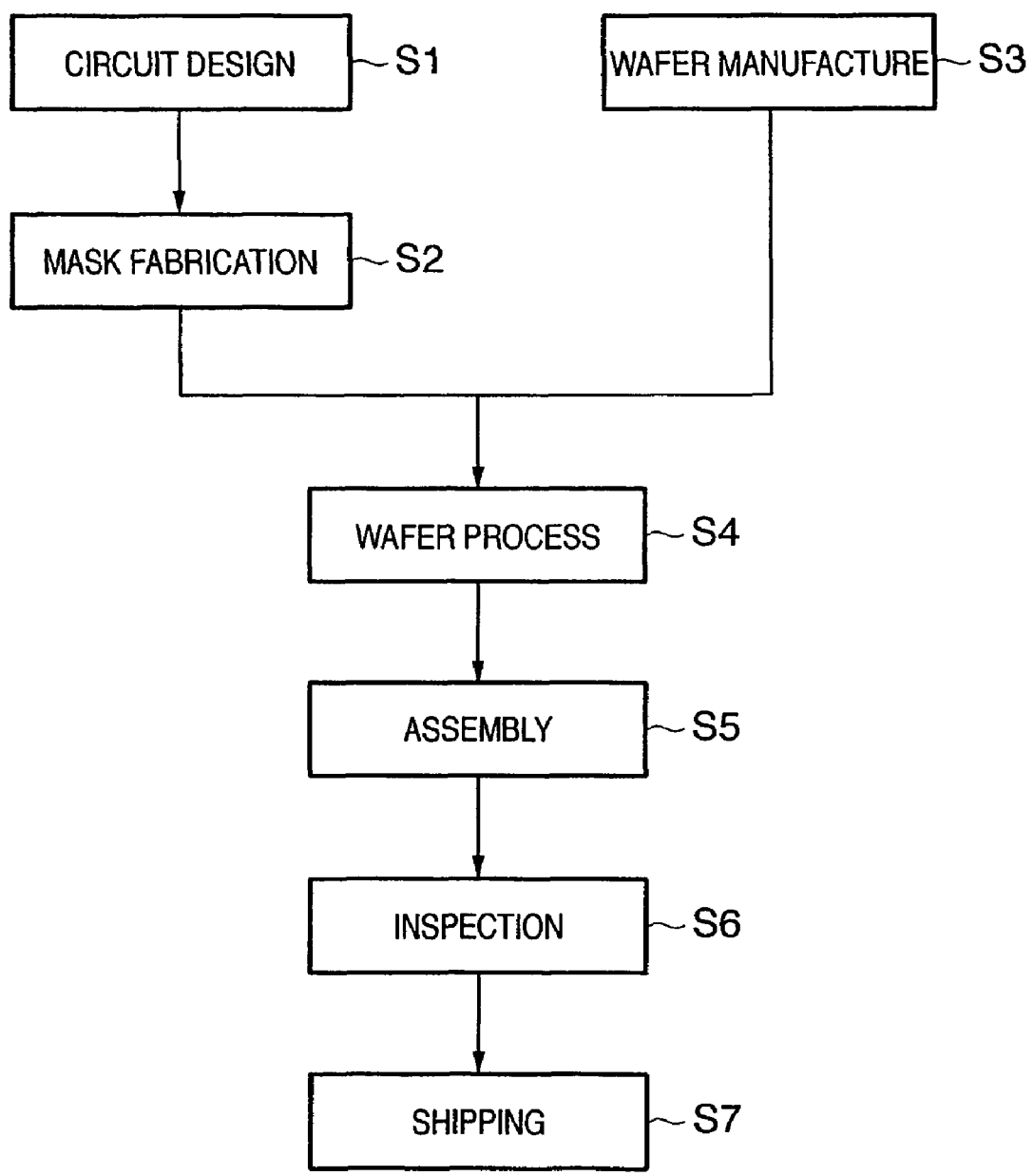
FIG. 6 is a flowchart for explaining the device manufacture using an exposure apparatus.

An embodiment of a device manufacturing method using the above-described exposure apparatus will be described next with reference to FIGS. 6 and 7. FIG. 6 is a flowchart for explaining the manufacture of a device (a semiconductor chip such as an IC or LSI, an LCD, or a CCD). A semiconductor chip manufacturing method will be exemplified here.

In step S1 (circuit design), a semiconductor device circuit is designed. In step S2 (mask fabrication), a mask is fabricated on the basis of the designed circuit pattern. In step S3 (wafer manufacture), a wafer is manufactured using a material such as silicon. In step S4 (wafer process) called a pre-process, the above-described exposure apparatus forms an actual circuit on the wafer by lithography using the mask and wafer. In step S5 (assembly) called a post-process, a semiconductor chip is formed by using the wafer manufactured in step S4. This step includes an assembly step (dicing and bonding) and packaging step (chip encapsulation). In step S6 (inspection), the semiconductor device manufactured in step S5 undergoes inspections such as an operation confirmation test and durability test. After these steps, the semiconductor device is completed and shipped (step S7).

Figure 7:
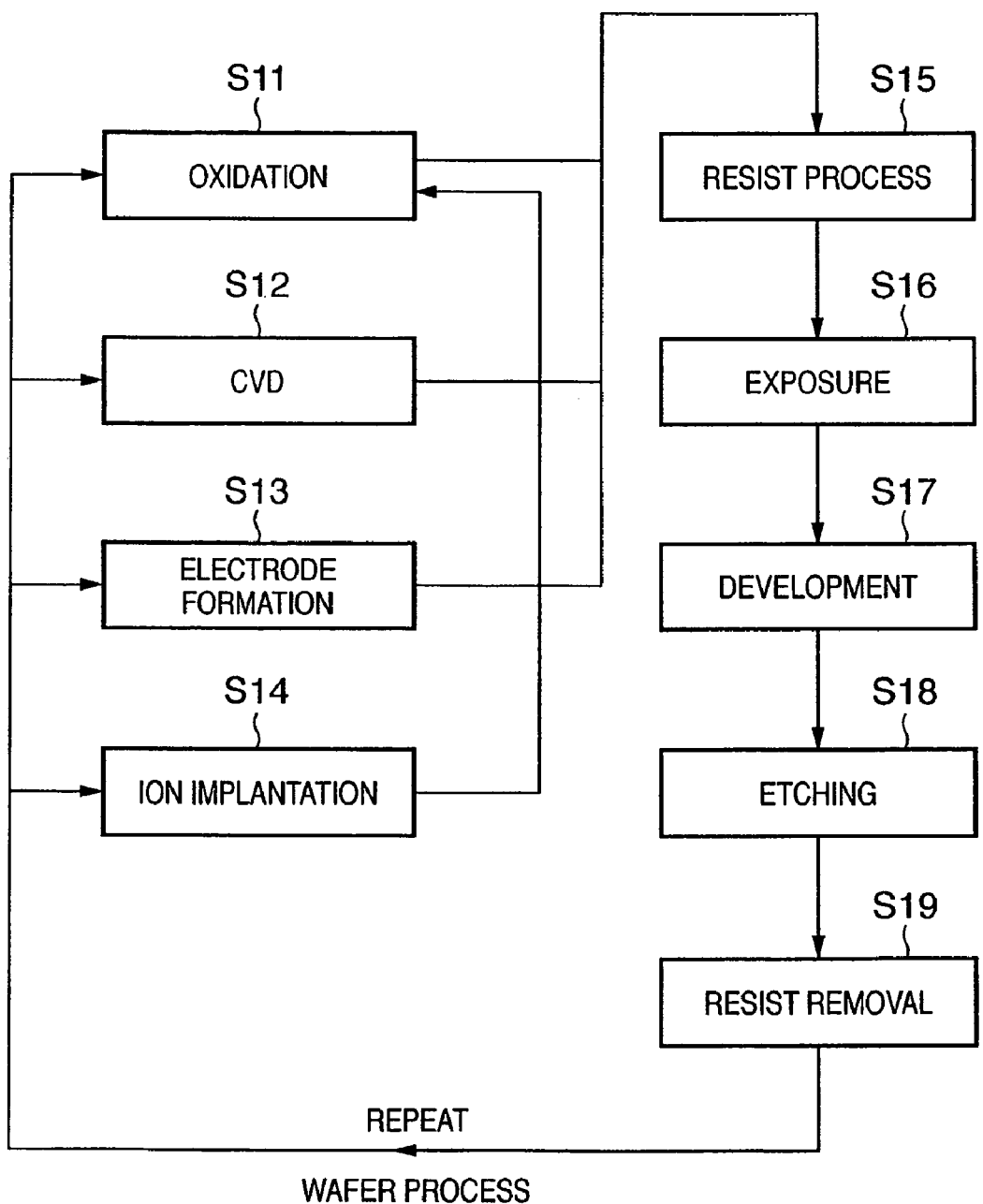
FIG. 7 is a flowchart showing details of the wafer process in step S4 of the flowchart shown in FIG. 6.

FIG. 7 is a flowchart showing details of the wafer process in step S4. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the above-described exposure apparatus forms by exposure the circuit pattern of the mask on the wafer. In step S17 (development), the exposed wafer is developed. In step S18 (etching), portions other than the developed resist image are etched. In step S19 (resist removal), any unnecessary resist remaining after etching is removed. These steps are repeated to form multiple circuit patterns on the wafer.

Although the preferred embodiments of the present invention have been described above, the present invention is not limited to the above embodiments and various changes and modifications can be made within the spirit and scope of the present invention.

As many apparently widely different embodiments of the present invention can be made without departing from the spirit and scope thereof, it is to be understood that the invention is not limited to the specific embodiments thereof except as defined in the claims.

This application claims the benefit of Japanese Patent Application No. 2005-080586 filed on Mar. 18, 2005, which is hereby incorporated by reference herein in its entirety.

What is claimed is:

1. An exposure apparatus which transfers a pattern of a reticle onto a substrate using EUV (Extreme Ultraviolet) light, the apparatus comprising:
   a beam providing unit including at least a first structure, a second structure and a reticle stage configured to hold and to move the reticle, said beam providing unit being configured to provide EUV light beam having pattern information to the substrate, said first structure and second structure being supported independently of each other, said second structure including an illumination optical system, and said first structure including a barrel containing a mirror which reflects EUV light provided by said illumination optical system so as to illuminate the reticle and a projection optical system which projects EUV light beam reflected from the reticle onto the substrate, said illumination optical system being configured to emit the EUV light beam such that the reticle is illuminated by said illumination optical system via said mirror contained in said barrel;
   a measurement unit which measures a relative variation between said first structure and said second structure;
   a driving mechanism which drives said second structure; and
   a controller which controls said driving mechanism on the basis of a measurement result obtained by said measurement unit so as to reduce a relative variation between said first structure and said second structure in at least a period during which the pattern is transferred onto the substrate.

2. The apparatus according to claim 1, wherein the relative variation includes a variation in relative position.

3. The apparatus according to claim 1, wherein the relative variation includes a variation in relative velocity.

4. The apparatus according to claim 1, wherein the relative variation includes a variation in relative acceleration.

5. The apparatus according to claim 1, wherein said measurement unit includes:

a first measurement device which measures a relative variation between said first structure and a reference structure;

a second measurement device which measures a relative variation between said second structure and said reference structure; and an arithmetic device which calculates a relative variation between said first structure and said second structure on the basis of a measurement result obtained by said first measurement device and a measurement result obtained by said second measurement device.

6. The apparatus according to claim 1, wherein said measurement unit includes one of a laser interferometer, an encoder, a capacitance sensor, an eddy current sensor and a differential transducer displacement sensor.

7. The apparatus according to claim 1, wherein said driving mechanism includes one of a linear motor, a piezoelectric element and an air actuator.

8. An exposure method of transferring a pattern of a reticle onto a substrate by using an exposure apparatus comprising a beam providing unit which includes at least a first structure, a second structure a reticle stage configured to hold and to move the reticle, and is configured to provide EUV (extreme ultraviolet) light beam having pattern information to the substrate, and a measurement unit which measures a relative variation between the first structure and the second structure, the second structure including an illumination optical system, and the first structure including a barrel containing a mirror which reflects EUV light provided by said illumination optical system so as to illuminate the reticle and a projection optical system which projects EUV light beam reflected from the reticle onto the substrate, the illumination optical system being configured to emit the EUV light beam such that the reticle is illuminated by the illumination optical system via the mirror contained in the barrel, the method comprising driving the second structure on the basis of a measurement result obtained by the measurement unit so as to reduce the relative variation between the first structure and the second structure in at least a period during which the pattern is transferred onto the substrate.

9. A device manufacturing method comprising steps of:

exposing a wafer using an exposure apparatus defined in claim 1; and developing the wafer.

* * * * *